(12) United States Patent
Johns et al.

(10) Patent No.: US 10,402,298 B2
(45) Date of Patent: Sep. 3, 2019

(54) SYSTEM AND METHOD FOR COMPREHENSIVE PERFORMANCE AND AVAILABILITY TRACKING USING PASSIVE MONITORING AND INTELLIGENT SYNTHETIC TRANSACTION GENERATION IN A TRANSACTION PROCESSING SYSTEM

(71) Applicant: Insightete Corporation, Dublin, OH (US)

(72) Inventors: William Johns, Dublin, OH (US); Patrick M. Bradford, Dublin, OH (US)

(73) Assignee: Insightete Corporation, Dublin, OH (US)

( * ) Notice: Subject to any disclaimer, the term of this patent is extended or adjusted under 35 U.S.C. 154(b) by 169 days.

(21) Appl. No.: 15/472,815

(22) Filed: Mar. 29, 2017

(65) Prior Publication Data
US 2017/0199800 A1    Jul. 13, 2017

Related U.S. Application Data

(63) Continuation of application No. 14/510,803, filed on Oct. 9, 2014, now Pat. No. 9,639,445.

(51) Int. Cl.
*G06F 11/34*    (2006.01)
*G06F 11/30*    (2006.01)
*G06F 17/50*    (2006.01)

(52) U.S. Cl.
CPC ...... *G06F 11/3409* (2013.01); *G06F 11/3006* (2013.01); *G06F 11/3055* (2013.01);
(Continued)

(58) Field of Classification Search
CPC ............ G06F 11/3055; G06F 11/3006; G06F 11/3093; G06F 11/3414; G06F 11/3438; G06F 11/3409; G06F 11/3096
See application file for complete search history.

(56) References Cited

U.S. PATENT DOCUMENTS

| 5,937,165 A | 8/1999 | Schwaller et al. |
| 6,397,359 B1 * | 5/2002 | Chandra ............. H04L 41/5009 709/224 |

(Continued)

OTHER PUBLICATIONS

Thurmann, "Virtual user simulation", Master's Thesis—University of OSLO, Department of Informatics. 2005 (see pp. 25-30); https://www.duo.uio.no/bitstream/handle/10852/9261/vsim.pdf?sequence=2.

*Primary Examiner* — Nadeem Iqbal
(74) *Attorney, Agent, or Firm* — Blank Rome LLP

(57) ABSTRACT

One or more passive collectors watch a system's real activity confirming normal responses to requests. This passive monitor may have other purposes such as measuring real performance, and determining normal completion of requests which provides complete and accurate performance and availability of the monitored system. When the passive monitoring no longer detects actual activity, the preferred embodiment automatically triggers the execution of synthetic activity which simulates the real usage of the system. This active monitoring determines the state of the usage of the system. If the simulated use of the system results in an abnormal completion of the activity, an outage is recorded. The simulation occurs on a regular interval until the passive monitor sees real normal activity.

20 Claims, 5 Drawing Sheets

(52) U.S. Cl.
CPC ...... *G06F 11/3093* (2013.01); *G06F 11/3096* (2013.01); *G06F 11/3438* (2013.01); *G06F 17/5009* (2013.01); *G06F 11/3414* (2013.01)

(56) References Cited

U.S. PATENT DOCUMENTS

| | | | |
|---|---|---|---|
| 6,625,648 B1 * | 9/2003 | Schwaller | H04L 41/0213 370/230 |
| 6,763,380 B1 * | 7/2004 | Mayton | H04L 41/14 709/223 |
| 6,901,442 B1 * | 5/2005 | Schwaller | H04L 43/0817 709/223 |
| 7,487,508 B2 | 2/2009 | Fu et al. | |
| 7,519,958 B2 * | 4/2009 | Griep | G06F 11/3414 717/127 |
| 7,543,051 B2 | 6/2009 | Greifeneder et al. | |
| 7,594,009 B2 | 9/2009 | Triulzi et al. | |
| 7,607,176 B2 * | 10/2009 | Leone | G06F 21/10 713/187 |
| 7,730,352 B2 | 6/2010 | Marquardt et al. | |
| 8,040,811 B2 * | 10/2011 | Edwards | H04L 41/22 370/241 |
| 8,326,971 B2 | 12/2012 | Dickerson et al. | |
| 9,276,819 B2 * | 3/2016 | Maon | H04L 41/14 |
| 9,639,445 B2 * | 5/2017 | Johns | G06F 11/3055 |
| 2003/0163608 A1 | 8/2003 | Tiwary et al. | |
| 2004/0015600 A1 * | 1/2004 | Tiwary | G06F 11/3414 709/234 |
| 2006/0224898 A1 | 10/2006 | Ahmed | |
| 2007/0081467 A1 * | 4/2007 | Hurst | H04L 43/50 370/248 |
| 2009/0100294 A1 | 4/2009 | Fellenstein et al. | |
| 2012/0304130 A1 | 11/2012 | Rueff et al. | |
| 2013/0282354 A1 | 10/2013 | Sayers et al. | |

\* cited by examiner

Figure. 1 -- Physical Layout
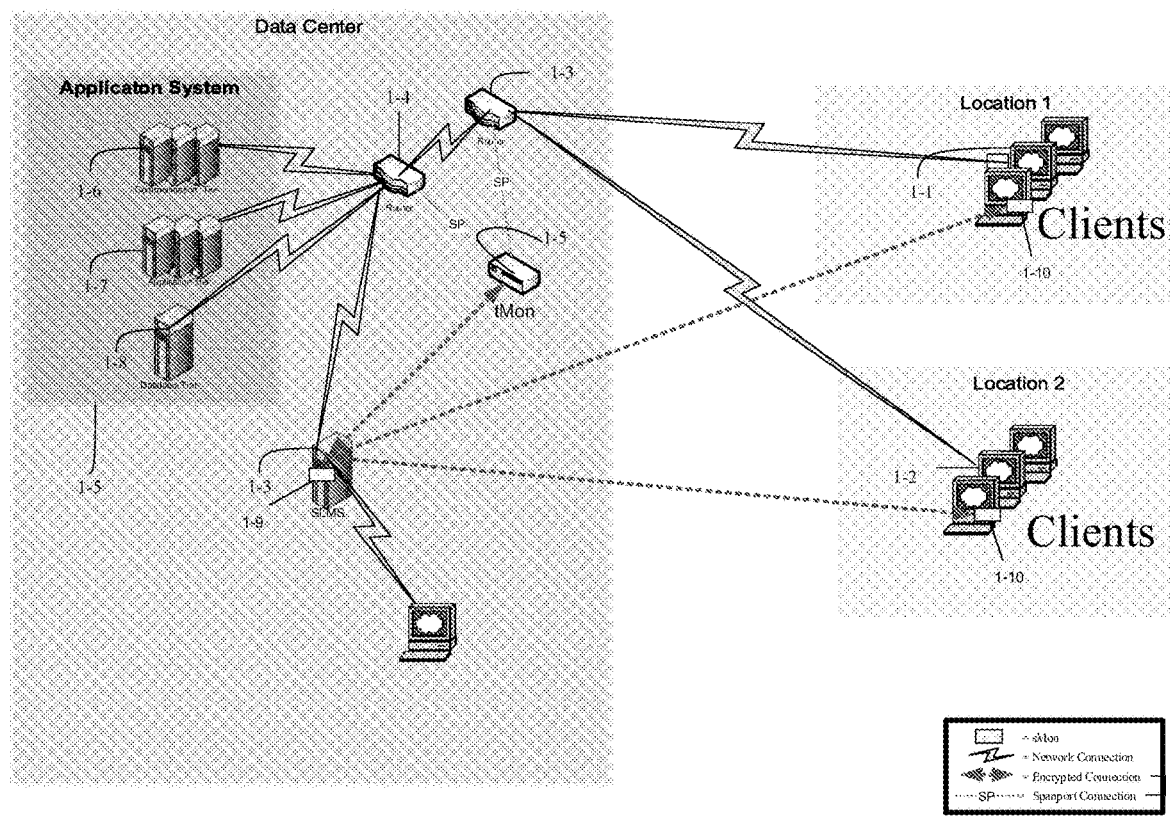

Figure. 2 – Main SLMS Processing
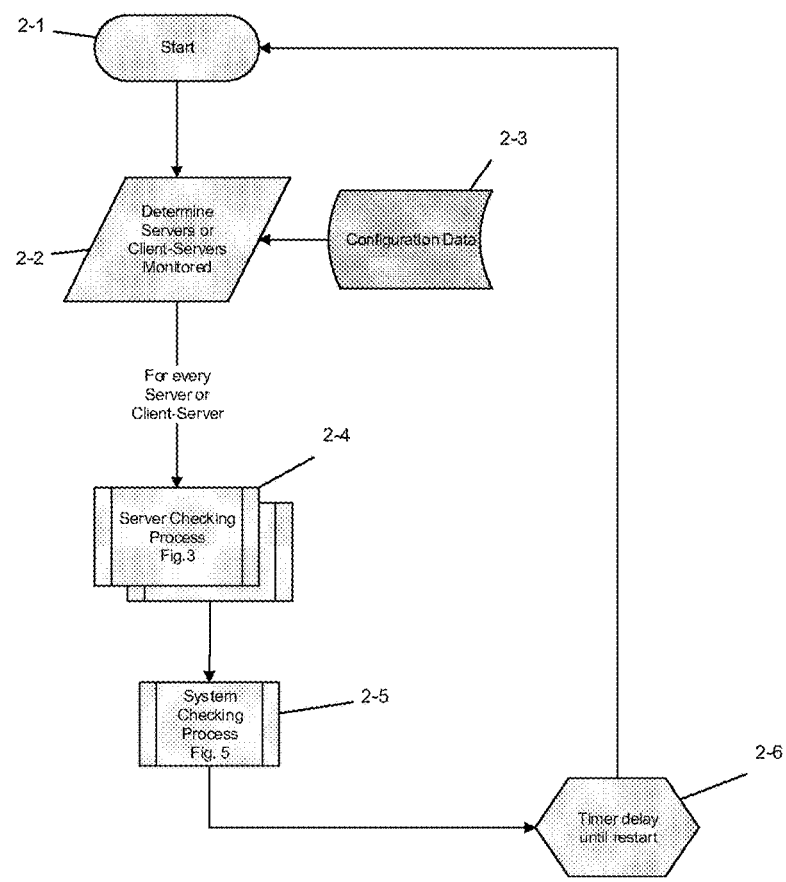

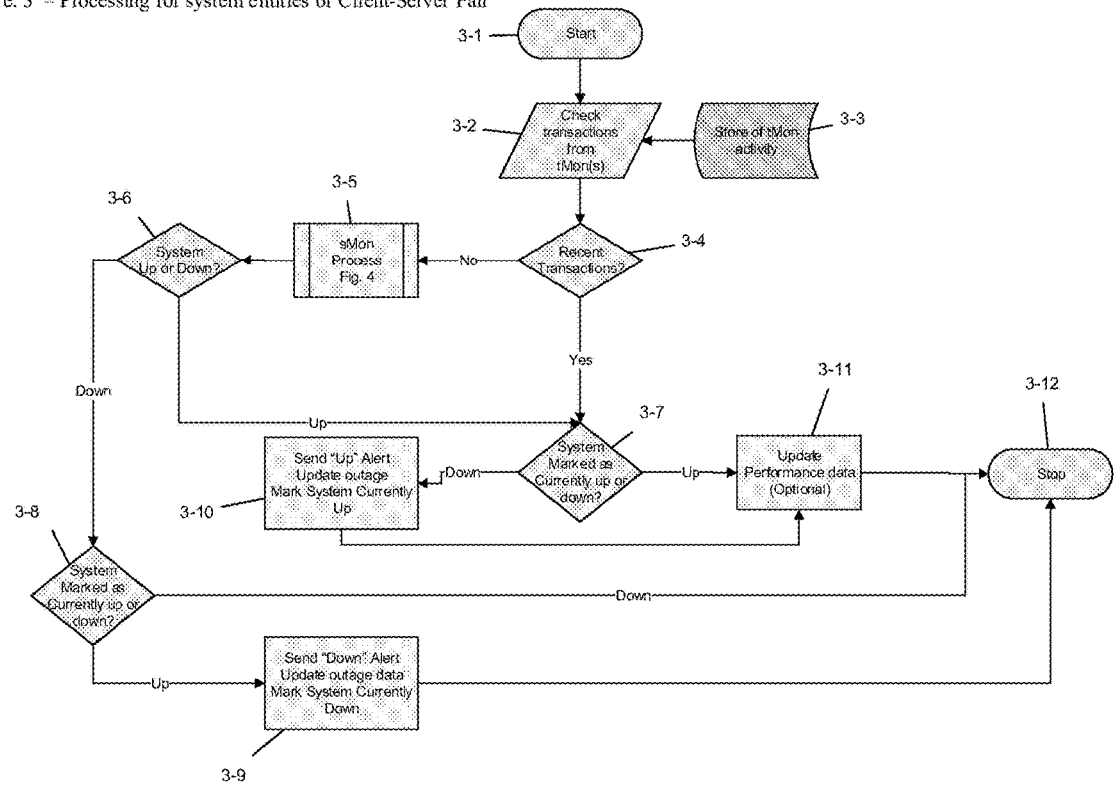
Figure. 3 – Processing for system entities or Client-Server Pair

Figure. 4 — sManager Processing
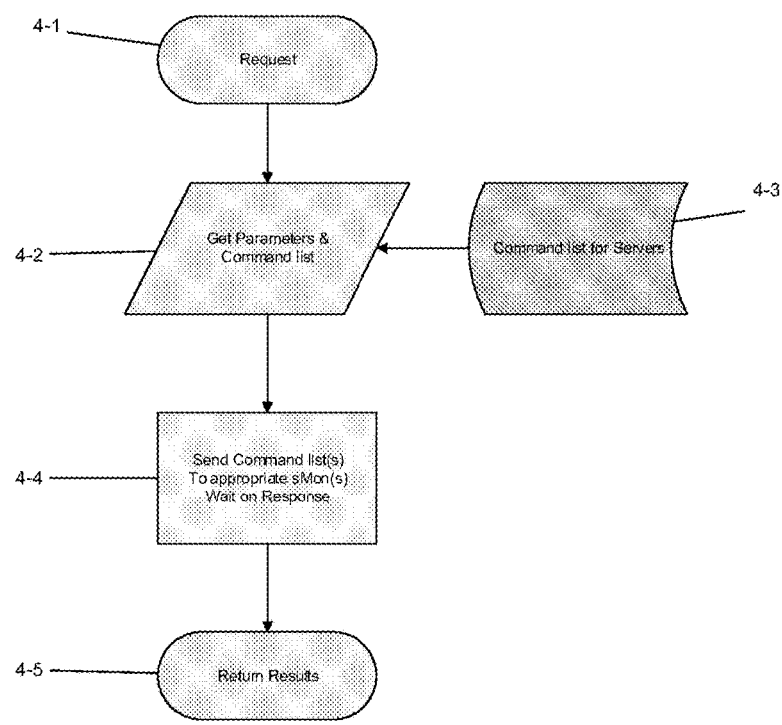

Figure. 5 – System Check Processing
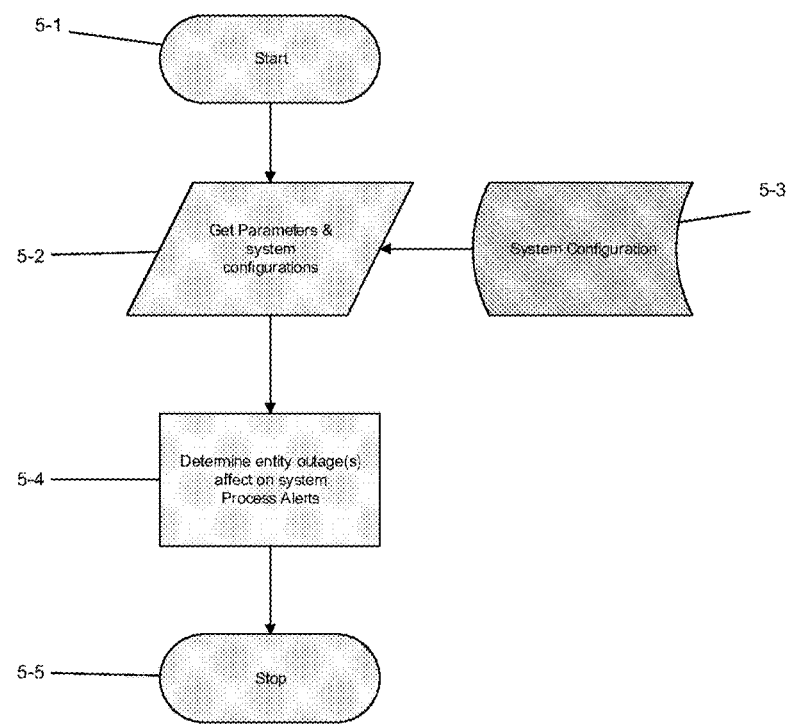

SYSTEM AND METHOD FOR COMPREHENSIVE PERFORMANCE AND AVAILABILITY TRACKING USING PASSIVE MONITORING AND INTELLIGENT SYNTHETIC TRANSACTION GENERATION IN A TRANSACTION PROCESSING SYSTEM

This application is a Continuation of U.S. patent application No. 14/510,803, filed Oct. 9, 2014, which is hereby incorporated by reference.

BACKGROUND

Passive monitors are widely used for determining performance of the usage of systems. Although passive monitors have proven to be accurate at measuring performance of a system, if used to track availability of a system, they have proven to be inaccurate especially during time periods when usage is infrequent or idle and there is no activity to monitor. Real usage of the system must be occurring to confirm that the system is up and ready to work normally.

Active monitors, such as synthetic activity generators, are used to simulate activity to confirm normal performance and also check availability of a system. Active monitors have proven to be less accurate at determining true performance, but can be very accurate at determining the system's availability for normal activity.

The problem with active monitors is that in order to work, they need to continue to execute simulated activity even during peak times of system usage and can become very intrusive. They are known to consume significant amounts of expensive system resources that need to be available for real production activities, thus impacting both performance and throughput. Active monitors need to continue to generate activity continuously to accurately monitor, even when the system is at peak usage. In one technique, active monitoring of interactive computer transaction systems using synthetic transaction generators, active monitoring is known to consume from 5 to as much as 60 percent of a system's resources where the active monitoring is used to assure the system is available for normal activity.

Synthetic activity generators are the most common viable availability tracking method available for real time systems. However, they have proven to consume too many resources of a system to be used extensive enough to achieve the accuracy needed in the industry. Synthetic activity typically executes the same type of activity repeatedly, usually within a short period of time. In the above described technique, active monitoring of interactive computer transaction systems using synthetic transaction generators, the data associated with the synthetic transactions tend to remain in cache memories such as disk drive cache and system buffers. As a consequence, in this technique, this type of monitoring will give an overly optimistic indication of actual end-user performance experience. Also, in this technique, this type of monitoring tool uses the most precious resources on the monitored systems: CPU, disk, network, and memory, limiting those resources availability for real business transactions. Hence, this type of monitoring has proven to be very costly and detrimental to performance, yet continues to be used as an early warning for critical systems such as online banking systems, Bank ATM systems, and other systems that have an immediate impact on corporate revenues.

SUMMARY OF THE INVENTION

The preferred embodiment described herein combines the advantages of both passive and active methods of monitoring to provide both accurate activity performance monitoring and accurate system availability tracking without the disadvantages of each method. The system is designed with both the passive monitor technology and active monitor technology combined as an integrated intelligent solution.

The passive monitoring technology is continuously running and performing its function of accurate performance tracking while the active monitoring technology remains in standby mode and is not used until needed. The passive monitoring tracks performance, with the added ability to record normal system availability as long as activity on the system is normal. If activity is no longer seen by the passive monitor, it then automatically triggers the active monitoring technology to send synthetic activity through the system to test for normal processing. If the activity fails to complete normally, the monitored system is recorded as being unavailable. If the active monitor's synthetic test shows normal completion, the performance information is recorded to give a complete, "around the clock" indication of the system's ability to maintain acceptable performance and normal system availability is also determined.

Since this monitoring technology is passive and non-intrusive when the system is performing real activity, and in fact, only needs to use active monitoring when the system is not being used, it does not use precious system resources to achieve extensive and accurate availability monitoring while at the same time achieving the goal of accurate performance monitoring embodied in one integrated solution.

In a simple embodiment, this method is used to collect information between a server of the system and the users of its services. In another embodiment, this method collects for a group of servers providing services for the users of the services. In another embodiment. this method collects information for each location of users using a centralized service to determine information for each location of users.

BRIEF DESCRIPTION OF THE DRAWINGS

Preferred embodiments are described hereinafter with reference to the accompanying drawings.

FIG. 1 shows the physical layout of a monitored system along with the configuration of the preferred embodiment.

FIG. 2 is the flowchart of the Primary management of the System

FIG. 3 is the flowchart of the processes for each monitored entity.

FIG. 4 is the flowchart of the sub-process when an entity is discovered to be down.

FIG. 5 is the flowchart of processes that determination the effect on the entire system from outages of entities.

DETAILED DESCRIPTION AND BEST MODE OF IMPLEMENTATION

To best describe the configuration and function of the preferred embodiment, an example of the usage of the embodiment is depicted in FIG. 1.

FIG. 1 shows a typical generic three-tier application environment 1-5 including a communication tier 1-6, an application tier 1-7, and a database tier, 1-8. An application as depicted usually has at least one, and typically more clients 1-1, 1-2 that are connected to the application environment via some form of communication link that is connected to the communication tier via communication routers 1-3.

In this type of interactive environment, clients make requests of servers and expect a return of results and/or information from the server. A "server" typically handles many client requests from multiple clients. A request and its corresponding response are referred to as a "transaction". A typical transaction requires many packets of data to traverse the communication link between the client and server to complete the transaction.

In a tiered application environment, the front tiers are clients of the back end tiers. For example, in the depicted application environment 1-5, the communication tier 1-6 is a client of the application tier 1-7, the server, and the application tier 1-7 is a client of the database tier 1-8, the server.

One common type of performance monitor for the type of environment described is a passive monitor. This type of monitor is often referred to as a "transaction monitor" or a "real user monitor." Physically, this type of monitor is plugged into the communication routers in such a way as to be able to see the packet traffic without interfering with the traffic. In FIG. 1, the passive monitor device that serves this purpose, the transaction monitor, "tMon" 1-5, is plugged into the span-ports of routers 1-3 and 1-4. This type of monitor is designed to passively watch the packets on a communication link between clients and servers and combine identification information, timestamps, etc. from the packets into detailed information about each transaction. The preferred embodiment is not specific to only this kind of passive monitor; it applies to any monitoring method which captures real user transactions. This list includes, but is not limited to: network packet sniffers, virtual machine add-ons, and log file readers.

Another common type of monitor is an active monitor typically designed to send scripted transactions to a server. Sometimes these transactions are intended to emulate a real user, and sometimes they are configured to generate a clearly synthetic heartbeat check of the system to ensure it is up and ready to accept connections. This type of monitor is referred to as a robot, a transaction generator, or a synthetic monitor. In FIG. 1, this type of monitor, typically software installed on any computing type device, is referred to as a sMon 1-9 and 1-10. sMon type monitors usually are designed to execute the scripts at a timed interval.

Another embodiment is a system including computing entities whereas one of these entities is a central management process or thread, hereafter referred to as the Service Level Management System or SLMS 1-3, another is one or more tMon processes or threads and the third is one or more sMon processes or threads.

The preferred embodiment teaches that as long as tMon(s) are actively seeing transactions for all of the monitored components and from monitored locations of clients of a system, then both accurate performance statistics are being collected and system availability is known and there is no need for the activities of any of the sMon(s). The preferred embodiment also teaches that if tMon(s) are no longer seeing transactions between any measured components or any client locations then the performance statistics are not being collected for that part of a system and availability is not known. The preferred embodiment further teaches that a manager, the SLMS, that communicates with the tMon(s) and knows the state of the tMon(s) collection, can activate sMon(s) to collect performance statistics and test availability where it detects that tMon(s) are not collecting complete information about the activity.

The purpose of the SLMS is to act as the centralized manager of the tMon(s) and sMon(s) and contains the repository for data collected from those entities. The SLMS may also manage the dashboards, alerting and reporting of performance and availability information to users of the information.

For example, for a web application system, the tMon(s) may get the exact time the client makes a page request and the time that that page is completely returned back to the client device giving an exact response time from request to delivery. It may also glean information from the transactions such as the page address, client address and other information that allows for a complete identification of the function of the transaction. The tMon(s) are communicating this information for every transaction to the SLMS in regular intervals.

The sMon(s) are processes or threads which can be run or created on any computing type device including, but not limited to: SLMS(s), tMon(s) and independent servers, workstations and client devices anywhere in the monitored environment. The purpose of the sMon(s) is to generate synthetic requests when requested to do so by the SLMS.

SLMS assures collection of performance information and availability statistics for defined servers, and optionally for all defined relationships between each tier of servers and groups of clients. The definitions of the monitored components, servers, tiers and client locations, are contained in a configuration. This configuration data defines the servers, the peer level tiers of the servers, client-server relationships, redundant entities and any other information that defines monitored entities and combinations of entities that make up a system. A peer level tier, like the communication tier 1-6 in FIG. 1, is a group of servers that have the same redundant function. The failure of any one or more of the servers within the tier does not affect the availability of the function of the tier for the clients using that tier as long as at least one of the servers in the tier is still functioning. However, sometimes there is degraded performance of the functions. For example, the loss of the database tier 1-8 may affect only a percent of the functions of the application system, but no effect on the remaining functions.

There are multiple embodiments of the monitoring system. These embodiments can stand alone or in any combination to achieve the monitoring needed to achieve the goals of the user. In its simplest embodiment, the SLMS system monitors the availability and performance of the application in general for all clients. In this form, if the application is available for even one client the system is considered up and available and measurement of performance of any transaction is considered the performance for the system as a whole. In another embodiment, the system categorizes the transactions into business functions and the performance and availability of each is tracked. In another embodiment, the availability of certain functions of the backend tiers affects the percentage availability of the monitored system to the end-user. In another embodiment, each location of end-users is tracked separately and can affect the overall percentage of availability for the whole system.

FIG. 2 shows the details of the primary process to manage the complete collection for monitored systems. This process starting at 2-1 first determines the configurations all monitored components by accessing 2-2 the configuration data 2-3. For each entity and client-server pair that is defined to be monitored one checking process 2-4 is spawned. This process is passed the time interval and entity information it needs to complete its tasks. Once all of the entities have been checked for the interval, then the System Checking process 2-5 is spawned, then after a delay of the interval time 2-6, then the process starts over again 2-1.

FIG. 3 shows the details of the checking process. Each process is passed the appropriate parameters to check the need to spawn alerts, update data, and spawn active processes to do additional checking as needed to assure accuracy. After initialization 3-1, the process checks 3-2 the recent results from the passive monitor 3-3 for the entity it is designated to check. If no data has been collected within this interval 3-4 then the sManager 3-5 is invoked to actively check the entity. If the entity is found to be down 3-6 it is checked 3-8 to see if it was marked as down in a previous intervals. If so, the process is done 3-12. If it is marked as "Up", then a process 3-9 spawns Alert processing to issue real-time warnings, the entity is marked as currently "down", then the process is done 3-12. If the sManager 3-5 found the entity up and normal 3-6, then if the entity had previously been marked down 3-7 the process to update the condition 3-10 is invoked. This process 3-10 invokes the "Alert" process to inform users of the monitoring system that a previously "down" entity is up, and the entity is marked with the status of "Up". If the preferred embodiment is configured to do so, it uses performance data from the active monitor to update performance information using the performance update process 3-11 which is executed after which the process is complete 3-12.

FIG. 4 shows the processing of the sManager part of the SLMS manager. sManager is triggered by the main SLMS manager when the active monitor needs to gather information about entities. sManager first reads 4-2 the configuration data and command lists 4-3 to understand which commands and sMons to activate. The appropriate information is sent to the sMon(s) 4-4 and retrieves the results 4-5 and returns the results to the SLMS process 3-5.

FIG. 5 shows the final reduction of the findings of the previous processes in the main SLMS process 2-5. This final step is to determine the effect of any entity outage. A configuration of a monitored system, such as depicted in FIG. 1, that has multiple entities that make up the entirety of the system, has varies levels of availability. These levels of availability may include only entity outages, such as servers, that are redundant within a tier, consequently the system is still 100% available, but there is an entity out that needs attention to maintain redundancy. In another case, perhaps some clients aren't able to request transactions from a server because a communication link is down; however, most other clients are still able to connect. In this case, only a percent of the clients are experiencing unavailability, while the overall availability is some fraction of 100%. In other cases, an entire tier is down, or a single entity that all transactions require and the system is 100% unavailable.

Software to implement the above functionality can be provided on any suitable medium, including any suitable persistent storage medium or via download.

While preferred embodiments have been set forth above, those skilled in the art who have reviewed the present disclosure will readily appreciate that other embodiments can be realized within the scope of the invention. For example, any functionality of any embodiment can, wherever technically feasible, be incorporated into any other embodiment. Therefore, the present invention should be construed as limited only by the appended claims.

What is claimed is:

1. A method for determining availability of an information technology system, the method comprising:
providing a passive monitor that monitors usage of the information technology system without simulating usage of the information technology system;
providing an active monitor configured to simulate usage of the information technology system;
determining whether the passive monitor detects transactions between components of the information technology system;
simulating usage of the information technology system, by the active monitor, in response to a determination that the passive monitor does not detect transactions between components of the information technology system; and
recording an outage of the information technology system in response to a determination that the passive monitor does not detect transactions and the information technology system does provide normal responses to the simulated usage.

2. The method of claim 1, further comprising:
determining whether the passive monitor detects transactions for a plurality of monitored components.

3. The method of claim 2, wherein:
the plurality of monitored components includes a tiered application environment; and
determining whether the passive monitor detects transactions comprises determining whether the passive monitor detects transactions among the monitored components of the tiered application environment.

4. The method of claim 1, further comprising:
monitoring availability and performance of an application for a plurality of clients.

5. The method of claim 1, further comprising:
categorizing transactions into business functions and tracking performance and availability of each business function.

6. The method of claim 1, further comprising:
tracking performance and availability of the information technology system based on availability of functions of backend tiers of the information technology system.

7. The method of claim 1, further comprising:
tracking performance and availability of information technology system based on availability of the information technology system at each location of a plurality of end users.

8. The method of claim 1, wherein the passive monitor is a transaction monitor that passively watches packets on a communication link between components of the information technology system.

9. The method of claim 1, wherein the passive monitor is a network packet sniffer, a virtual machine add-on, a log file reader, or a monitoring method that watches real user transactions.

10. The method of claim 1, wherein the active monitor is configured to send scripted transactions to the components of the information technology system.

11. A system for determining availability of an information technology system, the system comprising:
a passive monitor that monitors usage of the information technology system without simulating usage of the information technology system;
an active monitor configured to simulate usage of the information technology system in response to a determination that the passive monitor does not detect transactions between components of the information technology system; and
a processor that records an outage of the information technology system in response to a determination that the passive monitor does not detect transactions and the information technology system does provide normal responses to the simulated usage.

12. The system of claim 11, wherein the passive monitor detects transactions for a plurality of monitored components.

13. The system of claim 12, wherein:
   the plurality of monitored components includes a tiered application environment; and
   the passive monitor detects transactions among the monitored components of the tiered application environment.

14. The system of claim 11, wherein the system monitors the availability and performance of an application for a plurality of clients.

15. The system of claim 11, wherein the system categorizes transactions into business functions and tracks performance and availability of each business function.

16. The system of claim 11, wherein the system tracks performance and availability of the information technology system based on availability of functions of backend tiers of the information technology system.

17. The system of claim 11, wherein the system tracks performance and availability of the information technology system based on availability of the information technology system at each location of a plurality of end users.

18. The system of claim 11, wherein the passive monitor is a transaction monitor that passively watches packets on a communication link between components of the information technology system.

19. The system of claim 11, wherein the passive monitor is a network packet sniffer, a virtual machine add-on, a log file reader, or a device that watches real user transactions.

20. The system of claim 11, wherein the active monitor is configured to send scripted transactions to the information technology system.

* * * * *